United States Patent [19]

Yamakido et al.

[11] 4,250,492
[45] Feb. 10, 1981

[54] NON-UNIFORM WEIGHTING CIRCUITRY

[75] Inventors: Kazuo Yamakido, Hachioji; Nobuo Tsukamoto, Tachikawa, both of Japan

[73] Assignee: Hitachi, Ltd., Japan

[21] Appl. No.: 840,178

[22] Filed: Oct. 7, 1977

[30] Foreign Application Priority Data

Oct. 12, 1976 [JP] Japan ................................ 51-121276

[51] Int. Cl.³ .......................................... H03K 13/02
[52] U.S. Cl. ...................... 340/347 DA; 340/347 AD; 340/347 M; 370/7
[58] Field of Search ... 340/347 M, 347 AD, 347 DA; 179/15 AV; 330/255; 370/7

[56] References Cited

U.S. PATENT DOCUMENTS

| | | | |
|---|---|---|---|
| 3,582,941 | 6/1971 | Le Maout | 340/347 M |
| 3,675,234 | 7/1972 | Metz | 340/347 DA |
| 3,685,045 | 8/1972 | Pastoriza | 340/347 DA |
| 3,705,359 | 12/1972 | Kappes | 340/347 AD |
| 3,723,896 | 3/1973 | Flickinger | 330/255 X |
| 3,735,264 | 5/1973 | Mauduech | 340/347 DA |

*Primary Examiner*—Thomas J. Sloyan
*Attorney, Agent, or Firm*—Craig and Antonelli

[57] ABSTRACT

A non-uniform weighting circuitry which is effective for enhancing speed and accuracy in the operations of encoders and decoders comprises in a cascade connection a constant current switch, a variable attenuator, a polarity changing circuit and a uniform weighting circuit. An impedance converting means is provided to make at least one of input and output terminals of the variable attenuator to be of low impedance, whereby spike-like noises generated by a switching element constituting a part of the variable attenuator is reduced.

11 Claims, 6 Drawing Figures

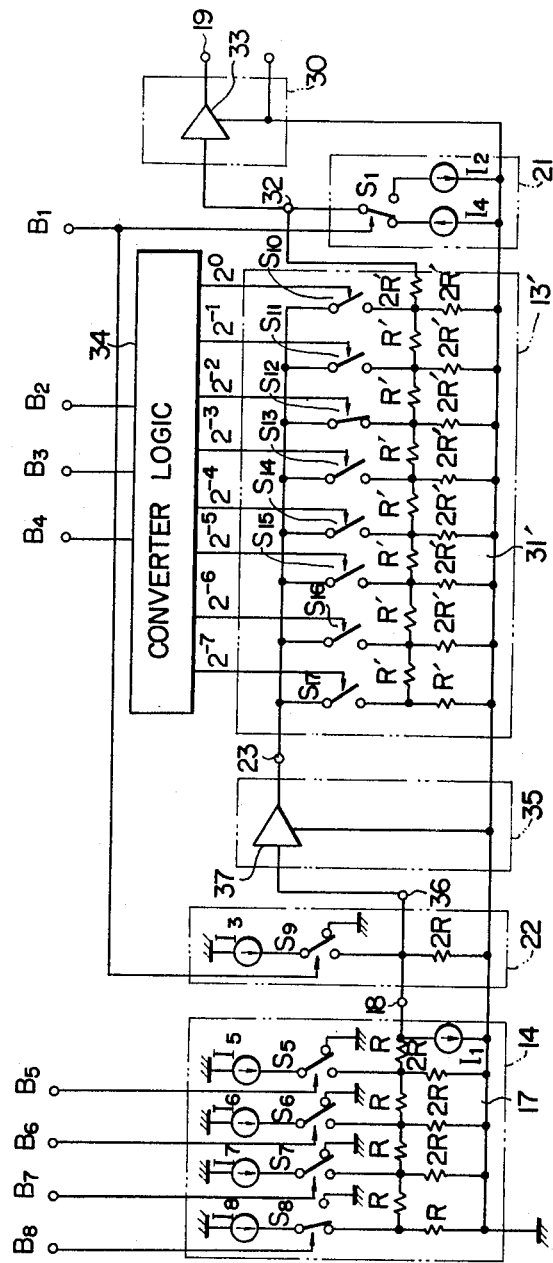
F I G. 4 ment 4,250,492

NON-UNIFORM WEIGHTING CIRCUITRY

LIST OF PRIOR ART REFERENCES (37 CFR 1.56(a)):

The following reference is cited to show the state of the art:

"Transmission Systems for Communications" published by Bell Telephone Laboratories Inc. (Fourth Edition, February 1970).

BACKGROUND OF THE INVENTION

The present invention relates to a non-uniform weighting circuitry for an encoder or decoder which is employed for analog-to-digital (A-D) conversion or for digital-to-analog (D-A) conversion of electric signals.

As new and more sophisticated communication services for audio, video and data communications as well as facsimiles (Fax) have been introduced in practical use, demand for communication systems having a high flexibility for instantly complying with many and various services has promoted developments of digital signal processing techniques such as digital transmission systems and digital converters. The heart of such digital signal processing techniques resides in encoders and decoders for A-D and D-A conversions of electric signals. In particular, in the field of communication, a non-uniform weighting circuitry imparted with non-uniform (non-linear) quantization characteristics is commonly used for the encoder and decoder with a view to reducing quantization noises at the time when signals of small magnitudes are processed. Performance as well as economy of the encoder and decoder depend on the non-uniform weighting circuit. For the non-uniform weighting circuitry there has been heretofore known a non-uniform weighting circuitry using an attenuator which is advantageous in that the circuit can be implemented in a simplified arrangement with a small number of component elements at a relatively strict requirement for accuracy imposed on operations of the circuit elements. For example, reference is to be made "Transmission Systems for Communications" published by Bell Telephone Laboratories Inc. (Fourth Edition, February 1970). The hitherto known non-uniform weighting circuitry such as referred to above allows the input and output characteristics of the encoder and decoder to be represented with segmental approximation with a plurality of line segments and is used for encoding amplitude information of a signal with a plurality of bits in total or decoding it. Among the bits, one bit is allotted for representing the signal polarity, some of bits are used for identifying the segment, and the remaining bits are used for representing steps in a single segment. To this end, the circuitry is composed of a polarity changing circuit, a constant current circuit, a variable attenuator and a uniform weighting circuit connected in a cascade configuration, as will be described hereinafter in detail. It is however noted in connection with the above described weighting circuit that inverter amplifiers are used in the polarity changing circuit and are required to be operated with a high accuracy, which in turn provides obstacle to the attempt for relaxing accuracy requirement imposed on the component elements of the whole circuits. Besides, addition of such inverter circuits will restrict the operating speed of the circuit.

As an attempt to obviate the difficulty described above, the inventors have already proposed an improved non-uniform weighting circuitry using an attenuator, as will be described hereinafter in detail in conjunction with FIG. 2 of the accompanying drawings (refer to, if necessary, Japanese Patent Application No. 126354/1975 filed Oct. 22, 1975). This improved circuit is of such arrangement that the polarity changing circuit is constituted by a constant current switching circuit and that the polarities of both bias currents applied to the uniform weighting circuit and the variable attenuator are changed in common by a drive signal from a polarity of bits. The improved circuit exhibits certainly many advantages as compared with the hitherto known circuit. However, due to the fact that the impedance of the variable attenuator can not be set arbitrarily at small values, spike-like noises generated by a switch which constitutes a part of the variable attenuator are undesirably superposed directly on the quantized output signal. An effort to reduce the influence of such spike-like noises will involve difficulty in attaining high speed operations of the encoder and the decoder.

SUMMARY OF THE INVENTION

An object of the invention is therefore to provide a non-uniform weighting circuitry using an attenuator which can be operated at a high speed with a high accuracy in a simplified circuit arrangement and suitably used for an encoder and decoder having high operation speed and accuracy.

Another object of the invention is to provide a non-uniform weighting circuitry operating at a high speed with an enhanced accuracy and capable of processing signals of non-uniform quantization characteristics thoroughly through digital techniques. In more particular, it is contemplated with the invention to enhance and improve the operation speed and accuracy of a non-uniform weighting circuitry which is composed of a constant current switching circuit, a variable attenuator, a polarity changing circuit and a uniform weighting circuit which are connected in cascade.

Still another object of the invention is to provide a variable attenuator circuit of a circuit arrangement which is effective for enhancing operation speed and accuracy of a non-uniform weighting circuitry which comprises a constant current switching circuit, a variable attenuator, a polarity changing circuit and a uniform weighting circuit connected in a cascade.

In order to attain the above-described objects, there is proposed according to an aspect of the invention a non-uniform weighting circuitry which is characterized in that a cascade connection of the constant current switching circuit, variable attenuator circuit, polarity changing circuit and uniform weighting circuit is additionally provided with an impedance conversion means for making at least one of input and output terminals of the variable attenuator circuit to be of low impedance, whereby spike-like noises as produced are rapidly attenuated without changing impedance of a weighted resistor network of the uniform weighting circuit. The impedance conversion means may be composed of an amplifier having a low output impedance or a low input impedance.

In a preferred embodiment of the variable attenuator circuit, a plurality of bi-directional or bipolar switch elements for changing magnitude of attenuation may be so arranged that signal input terminals or output terminals thereof are connected in parallel with one another, thereby to constitute an input terminal or an output terminal of the variable attenuator circuit while the impedance conversion means is constantly coupled to either the input or output terminal of the variable attenuator circuit. The parallel connection of the signal input or signal output terminals of the bi-directional switch elements means that unit or component attenuators of the variable attenuator circuit are connected in parallel with one another. When such unit attenuators are connected merely in cascade, it is impossible to rapidly attenuate the spike-like noises produced by switch elements of unit attenuators except for those located at the input or output side of the variable attenuator circuit. Thus, the intended effect can not be obtained in a satisfactory manner.

When the signal input or output terminals of the bi-directional (or bi-polar) switch elements are to be connected in parallel with one another, the variable attenuator circuit of the non-uniform weighting circuitry has to be driven by binary signal group derived by decoding the segment selecting bits with the aid of conversion logics instead of being directly driven by the segment selecting bits.

When the non-uniform weighting circuitry according to the invention is applied to an encoder, it is possible to connect a comparator amplifier of a low input impedance to the output stage of the non-uniform weighting circuitry thereby to impart to the comparator amplifier the same function as that of the impedance conversion means added to the output terminal of the variable attenuator circuit described above.

BRIEF DESCRIPTION OF THE DRAWINGS

FIG. 4 is a circuit diagram showing another embodiment of the invention in which impedance conversion means are additionally connected to both the input and output terminals of the variable attenuator circuit.

DESCRIPTION OF THE PREFERRED EMBODIMENTS

Before entering into description of the examplary embodiments of the invention, hitherto known non-uniform weighting circuitry will be described in respect to construction and operation thereof together with problems or disadvantages thereof in order to have a better understanding of the invention.

Figure 1:
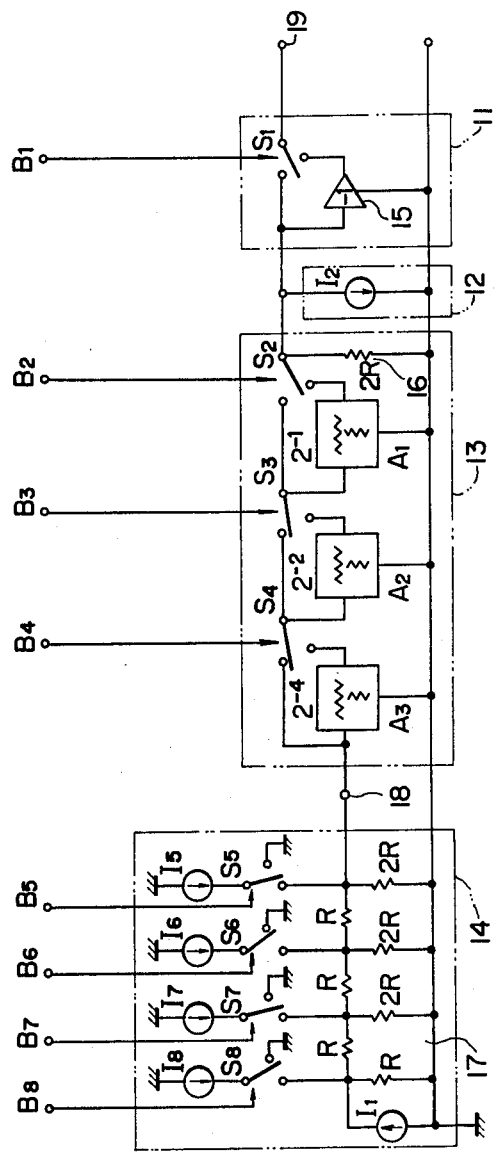
FIG. 1 is a circuit diagram showing an example of hitherto known non-uniform weighting circuit using an attenuator.

Referring to FIG. 1, a hitherto known non-uniform weighting circuitry of an attenuator type shown therein comprises a polarity changing circuit 11, a constant current source circuit 12, a variable attenuator 13 and a uniform weighting circuit 14 which are connected in cascade. In the case where such non-uniform weighting circuitry is used for an encoder or coder, the output from the output terminal 19 is compared with an input sample signal, the resultant difference signal being applied to a logic circuit to be encoded. In the case of a decoder, individual bits $B_1$, $B_2$, $B_3$, ..., $B_8$ of an input code signal are added together, whereby a corresponding decoded signal can be obtained from the output terminal 19.

As can be seen from FIG. 1, the polarity changing circuit 11 is composed of a switch element $S_1$ and an inverter amplifier 15 and serves for changing the polarity of output current in positive or negative direction in dependence on the sign of the polarity bit $B_1$. The constant current source circuit 12 including a constant current source $I_2$ serves to apply a d.c. bias to the output from the variable attenuator circuit 13 thereby to assure the continuity in the vicinity of zero level of the analog output signal.

The variable attenuator circuit 13 comprises a resistor 16 having resistance value of 2R for the impedance matching, three uni-directional switches $S_2$, $S_3$ and $S_4$ and three attenuators $A_1$, $A_2$ and $A_3$ having attenuation magnitudes corresponding to the powers of two, i.e. $2^{-1}$, $2^{-2}$ and $2^{-4}$, respectively. The attenuator circuit 13 serves to change eight attenuation magnitudes of $2^0$, $2^{-1}, 2^{-2}, \ldots, 2^{-7}$ in dependence upon combinations of three more significant bits (segment selecting bits) $B_2$, $B_3$ and $B_4$ of the input digital signal. The input and output impedances of the variable attenuator circuit 13 are each selected at 2R for matching with the characteristic impedance of a weighted resistor network 17.

The uniform weighting circuit 14 comprises a constant current switch circuit constituted by four uni-directional switch elements $S_5$, $S_6$, $S_7$ and $S_8$ connected to constant current sources $I_5$, $I_6$, $I_7$ and $I_8$, respectively, the weighted resistor network 17 having resistance value R or 2R and so arranged that the impedances measured from four terminals to which the current sources $I_5$ to $I_8$ are connected through switches $S_5$ to $S_8$ become equal to one another at $\frac{8}{3}$ R, and a constant current source $I_1$ for applying a d.c. bias. The uniform weighting circuit serves to produce at the output terminal 18 thereof sixteen ($=2^4$) analog signals each having a uniform interval between amplitudes thereof and varying linearly in dependence on combinations of four or less significant bits $B_5$, $B_6$, $B_7$ and $B_8$ (uniform decoding bits, or step bits for identifying steps in a segment).

In describing the operation of the non-uniform weighting circuitry of the construction described above, it is assumed merely for convenience' that the circuit is used for an encoder. It will however be appreciated that the circuit is operated in a similar manner when used for a decoder. Assuming that each of the current values of the constant current sources $I_5$ to $I_8$ is equal to $I_0$, while the current levels of the constant current sources $I_1$ and $I_2$ are, respectively, equal to $I_1$ and $I_2$ (in this conjunction, the constant current sources and the current values or levels thereof will be hereinafter represented by the same reference symbols unless otherwise specified), then the amplitude of the output signal obtained from the uniform weighting circuit 14 has a minimum value $I_1/12$ and a maximum value $(I_1 + 15 I_0)/12$. When the circuit 14 is combined with the variable attenuator circuit 13 and the constant current source circuit (d.c. bias circuit) 12, there will be produced at the output terminal 19 the signals having different amplitudes represented by following expressions;

| | |
|---|---|
| $\frac{1}{2^7}(\frac{I_1}{12}) - I_2$ : | minimum amplitude value (the first amplitude value in the least significant segment). |
| $\frac{1}{2^7}(\frac{I_1 + nI_0}{12}) - I_2$ : | (n + 1)-th amplitude value in the least significant segment wherein $0 \leq n \leq 15$, and n is n-th quantized amplitude value. |
| $\frac{1}{2^6}(\frac{I_1 + nI_0}{12}) - I_2$ : | (n + 1)-th amplitude value in the second segment. |
| $\frac{1}{2^{8-m}}(\frac{I_1 + nI_0}{12}) - I_2$ : | (n + 1)-th amplitude value in the m-th segment. |
| $\frac{1}{2^0}(\frac{I_1 + nI_0}{12}) - I_2$ : | (n + 1)-th amplitude value in the most significant or 8-th segment. |

Accordingly, when the constant current values are so set that, relative to the reference value 1 corresponding to the minimum amplitude value, the amplitude values in the least significant segment may vary in a series of 3, 5, ..., 31 with every increment of 2, the amplitude values in the second segment may vary in a series of 35, 39, ..., 95 with every increment equal to 4, and in a similar manner amplitude values in the third to eighth segments vary with increments of 8, 16, ... 256, respectively, with the maximum amplitude then being equal to 8159, there can be implemented a non-uniform weighting circuitry having the non-uniform quantizing characteristics approximated by fifteen segments which can identified by using eight bits. The current values may be determined for example from the following expressions:

$$\frac{1}{2^7}(\frac{I_1}{12}) - I_2 = 1$$

$$\frac{1}{2^7}(\frac{I_1 + 15 I_0}{12}) - I_2 = 3$$

$$\frac{1}{2^6}(\frac{I_1}{12}) - I_2 = 35$$

Thus, the current $I_0$ is equal to 3072 and $I_1$ is equal to 52224 with $I_2$ equal to 33. Since the current values may be in a form of relative ratios in the practical circuit design, the current $I_1$ and $I_2$ may be determined from $I_0$ in accordance with $I_1 = 17 I_0$ and $I_2 = 33/3072 \cdot I_0$.

The non-uniform weighting circuitry of the attenuator type will operate on the basis of the principle described above and is advantageous in that, although the ratio between the maximum and minimum amplitude values of the output signal from the non-uniform weighting circuitry shown in FIG. 1 corresponds in reality to a magnitude requiring thirteen bits, it is possible to realize the circuit with four or five bits with substantially the same accuracy as that of a uniform weighting circuit. However, for practical application, the inverter amplifier 15 is indispensable for changing the polarity of the analog output signal and has to be implemented with an accuracy equivalent to thirteen bits. Under such circumstances, the accuracy requirement imposed on the whole circuit will remain the same notwithstanding of the advantages describe above. Besides, disposition of the inverter amplifier will restrict the operating speed of the non-uniform weighting circuitry. In other words, in the case of the hitherto known non-uniform weighting circuitry such as described above, the output signal from the uniform weighting circuit is of a single polarity and hence the uni-directional switch elements $S_2$, $S_3$, $S_4$ are employed, the polarity changing has to be effected through the inverter amplifier after having been converted into the analog signal. Consequently, the advantages of the non-uniform weighting circuitry of the attenuator type such as no requirement for strict accuracy on the circuit components, simplification of circuit arrangement and a high speed operation can not be attained in a satisfactory manner.

Figure 2:
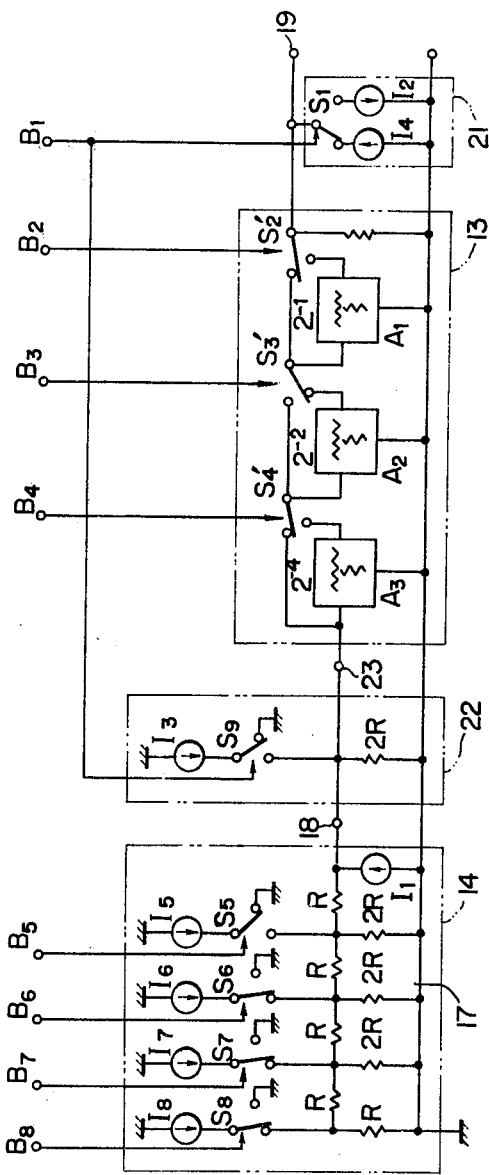
FIG. 2 is a circuit diagram showing an exemplary embodiment of the non-uniform weighting circuitry of an attenuator type which has been already developed by the inventors of the present application.

FIG. 2 is a circuit diagram showing an arrangement of the non-uniform weighting circuitry using an attenuator which has been prior developed by the inventors and is improved over the prior art circuit such as the one described above. The non-uniform weighting circuitry shown in FIG. 2 includes a constant current switch circuit 21, a variable attenuator circuit 13, a polarity changing circuit 22 and a uniform weighting circuit 14 which are connected in cascade and in which the polarities of both the bias current applied to the output of the uniform weighting circuit 14 and the bias current applied to the output of the variable attenuator circuit 13 are changed over by a polarity bit $B_1$. Attenuation changing switches $S_2'$, $S_3'$ and $S_4'$ of the variable attenuator circuit 13 are each constituted by a bi-directional switch element. The constant current switching circuit 21 is composed of constant bias current sources $I_2$ and $I_4$ and switch $S_1$ for selecting the constant current sources in accordance with the polarity bit $B_1$. The polarity changing circuit 22 includes a cascade connection of a constant bias current source $I_3$ for supplying the bias current to the output of the uniform weighting circuit 14 and a switch $S_9$ adapted to perform switching or changing-over operation in depencence on the polarity bit $B_1$. A junction between the switch $S_9$ and a resistor 2R matched to the output impedance of the uniform weighting circuit 14 is connected between the input terminal 23 of the variable attenuator circuit 13 and the output terminal 18 of the uniform weighting circuit 14.

With such an arrangement of the non-uniform weighting circuitry as described above, it has been found that the drawback of the hitherto known circuit shown in FIG. 1 as discussed hereinbefore can be eliminated, while the circuit configuration can be simplified with the number of circuit elements as well as the accuracy requirement imposed thereon being reduced. Besides, the operation speed is also increased.

However, the impedance of the variable attenuator circuit 13 can not be selected at an arbitrarily decreased value, since this impedance has to be matched with the characteristic impedance of the weighted resistor network 17 of the uniform weighting circuit 14, which network 17 determines the amplitude values of the output signal in dependence on the products of the characteristic impedance thereof and the current values of the constant current sources $I_5$ to $I_8$ as well as $I_1$ and $I_3$. Under the circumstance, spike-like noises produced by attenuation changing switches $S_2'$, $S_3'$ and $S_4'$ will be directly superposed on the quantized output signal.

Now considering the signal amplitude as an output to the terminal 19, the amplitude value of this signal corresponds to twelve bits (namely, lies in the range from the maximum amplitude value of 1 to minimum value of about 1/4096) in dependence on the combinations of the amplitude value of the uniform weighting circuit 17 corresponding to four bits (sixteen levels) and the attenuation quantities ($2^0$ to $2^{-7}$) of the variable attenuator circuit 13 corresponding to eight bits. On the other hand, since the maximum amplitude of the input signal which is digitally encoded after comparison with the output signal from the terminal 19 in a comparator in the case of use as an encoder is in general in the range of several volts to ten plus several volts, the minimum amplitude value of the non-uniform weighting circuitry will be extremely small and thus subjected directly to the influence of the switching spike noises produced in the variable attenuator circuit. In order to avoid such influence, it is necessary to suppress the amplitude value of noise to a fragment of the minimum amplitude value. In the case of the non-uniform weighting circuitry shown in FIG. 2, it takes necessarily a considerable time before the spike noises have been attenuated to a value sufficiently low as compared with the amplitude of the output signal. This provides an obstacle in the attempt to increase the operation speed of the encoder and decoder using the non-uniform weighting circuitry shown in FIG. 2.

Figure 3:
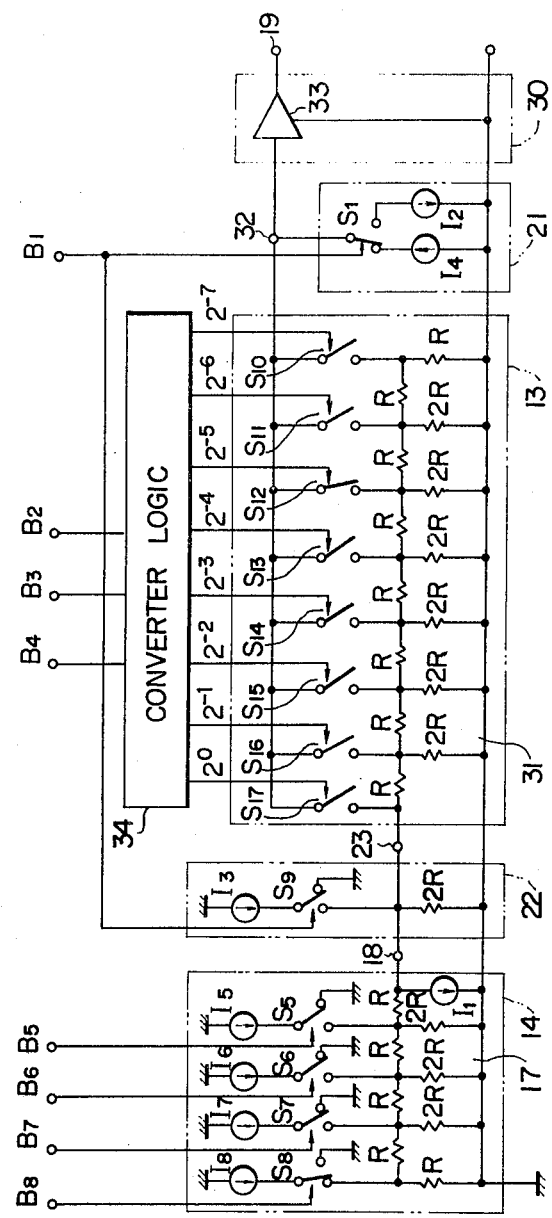
FIG. 3 is a circuit diagram showing an exemplary embodiment of the non-uniform weighting circuitry of the attenuator type according to the invention in which impedance conversion means is additionally connected to the output terminal of a variable attenuator circuit.

Now, reference is to be made to FIG. 3 which is a circuit diagram showing an exemplary embodiment of the non-uniform weighting circuitry using an attenuator according to the invention, wherein an amplifier having a low input impedance is connected to the output terminal of the variable attenuator circuit as the impedance conversion means. The non-uniform weighting circuitry shown in FIG. 3 is operative with eight bits through segmental approximation using fifteen segments as is in the case of the circuits shown in FIGS. 1 and 2. In FIG. 3, the same reference symbols as those used in FIGS. 1 and 2 denote the same or equivalent parts as those shown in these figures. An impedance conversion means 30 including an amplifier 33 of a low input impedance is connected to the output terminal 32 of the variable attenuator circuit 13, which comprises a ladder resistor network 31 having eight output terminals and eight bi-directional switch elements $S_{10}$ to $S_{17}$ each connected to each of the output terminals of the ladder resistor network 31. The other poles of these switch elements $S_{10}$ to $S_{17}$ are connected together in common and further connected to a pole of a switch element $S_1$ of the constant current switching circuit 21 at the output terminal 32 and to the input terminal of the low input impedance amplifier. As the control signals for the bi-directional switch elements $S_{10}$ to $S_{17}$, 8-bit signals are used which can be derived by converting the segment selecting bits $B_2$ to $B_4$ in a converter logic circuit 34 composed of a 3-8 decoder. Accordingly, changing of eight attenuator magnitudes or quantities can be accomplished by turning only one of the bi-directional switch elements $S_{10}$ to $S_{17}$ from "on" to "off" state, while another one switch element is concurrently turned from "off" to "on" state. Thus, the spike noises produced at the switch elements $S_{10}$ to $S_{17}$ will be rapidly attenuated through absorption by the amplifier of the low input impedance in combination with mutual cancellation of opposite polarities as described above. In this way, the time required for centering on a signal level desired for the output terminal 19 is shortened, whereby rapid operation can be attained.

Since the ladder resistor network 31 is constituted by a combination of resistors having resistance values R and 2R, the input and output impedances of the variable attenuator circuit 13 are matched with the characteristic impedance 2R of the uniform weighting circuit 14. By virtue of the connection of the polarity changing circuit 22 at the position shown in FIG. 3, the current value of the constant current source $I_3$ may be of substantially the same magnitude as the current value $I_O$ of the constant current source $I_5$ to $I_8$. Further, the connection of the d.c. constant bias current source $I_1$ for the weighted resistor network 17 at the output side of the uniform weighting circuit 14 brings about an advantage that the current value of the current source $I_1$ can be reduced to one-tenth as compared with the hitherto known circuit shown in FIG. 1 in which the current source $I_1$ is connected at the side of the least significant bit. Besides, accuracy of the individual resistors of the weighted resistor network 17 may be advantageously reduced by about one order. Of course, the invention is not restricted to such connection. As is in the case of the hitherto known circuit shown in FIG. 1, the connection of the constant bias current source $I_1$ may be made at the side of the least significant bits without departing from the teachings of the invention.

FIG. 4 shows a second embodiment of the invention in which the impedance conversion means are additionally provided at the input terminal and the output terminal. Referring to FIG. 4, an impedance conversion means 35 including an amplifier having a low output impedance for performing impedance conversion between the uniform weighting circuit 14 and a variable attenuator circuit 13' is connected between an output terminal 36 of the polarity changing circuit 22 and the input terminal 23 of the variable attenuator circuit 13'. The variable attenuator circuit 13' is composed of a ladder resistor network 31' having eight input terminals and eight bi-directional switch elements $S_{10}$ to $S_{17}$ connected, respectively, to the input terminals of the resistor network 31'. Other ends or poles of the bi-directional switch elements $S_{10}$ to $S_{17}$ are connected together with one another and to the output terminal of the low output impedance amplifier 37. The output from the variable attenuator circuit 13' is taken out from the side of $2^0$ bit of the ladder resistor network 31' and coupled to the constant current switching circuit 21 and the low input impedance amplifier 33 at the output terminal 37. With such circuit arrangement, most of the spike noises produced by the bi-directional switch elements $S_{10}$ to $S_{17}$ are transferred to the amplifier 37 to be rapidly attenuated, which results in a shortened time required for the output signal to center onto a predetermined level and hence an enhanced operation speed. By virtue of the insertion of the amplifier 37 of a low output impedance, the characteristic impedance ($\frac{2}{3}$ R' ) of the ladder resistor network 31' used in the variable attenuator circuit 13' can be set arbitrarily at small values without exerting adverse influence to the accuracy of attenuation in the range in which variations in the output level due to variation in the resistance values of the bi-directional switch elements $S_{10}$ to $S_{17}$ are allowable. The purpose and attainable effect brought about by the use of the amplifier 33 of low input impedance are the same as those obtained in the non-uniform weighting circuitry described hereinbefore in conjunction with FIG. 3. The insertion of the amplifier 37 of a low output impedance permits the operation of the non-uniform weighting circuitry shown in FIG. 3 to be effected at a considerably high speed. Accordingly, in applications where a strict requirement is not imposed on a high accuracy operation, the amplifier 33 of a low input impedance may be omitted.

Figure 5:
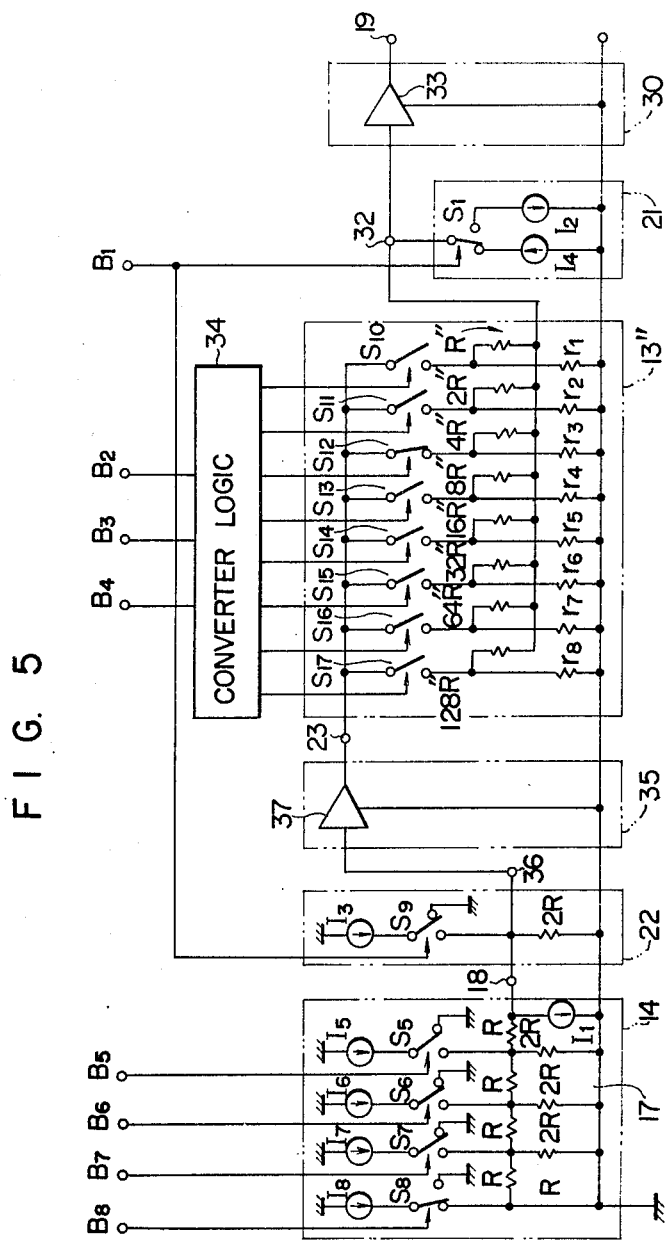
FIG. 5 is a circuit diagram showing still another embodiment of the invention in which the circuit arrangement of the variable attenuator circuit shown in FIG. 4 is modified.

FIG. 5 shows a third embodiment of the invention which is different from the first and second embodiments of the non-uniform weighting circuitries shown in FIGS. 3 and 4 in respect of the arrangement of the variable attenuator circuit. In more detail, in the case of arrangement of the variable attenuator circuit 13" shown in FIG. 5, eight bi-directional switch elements $S_{10}$ to $S_{17}$ are connected in parallel to the output terminal of the amplifier 37 having a low output impedance for impedance conversion, while each of the other poles of the bi-directional switch elements are connected to resistors which are different from one another and have resistance values of $R''$, $2R''$, $4R''$, ..., $128R''$, respectively, wherein the resistance $R''$ may be of any given value so far as the resistance value can compensate variations in the resistance value of the associated switch element in the conductive stage. Connected to the resistors $R''$, $2R''$, ..., $128R''$ are resistors $r_1$, $r_2$, $r_3$, ..., $r_8$ the resistance values of which are so selected that the load impedances of the eight switch elements may become equal to one another. Other ends of the resistors $R''$, $2R''$, $4R''$, ..., $128R''$ are connected together with one another and further connected to the constant current switch circuit 21 and the amplifier 33 of a low input impedance at the output terminal 32. With such circuit arrangement, it is possible to suppress the influences of electrostatic capacity existing between electrodes of the switch element which may be constituted by a field effect transistor or the like, whereby operation speed can be further increased. The remaining circuit portions are of the same configuration as those shown in FIG. 4. The low input impedance amplifier 33 as well as the low output impedance amplifier 37 serve for the same purpose and function as those shown in FIGS. 3 and 4. Namely, the spike noises are transferred to the low output impedance amplifier 37 to be thereby rapidly attenuated, while signal delays for every attenuation quantities can be made equal to one another.

Figure 6:
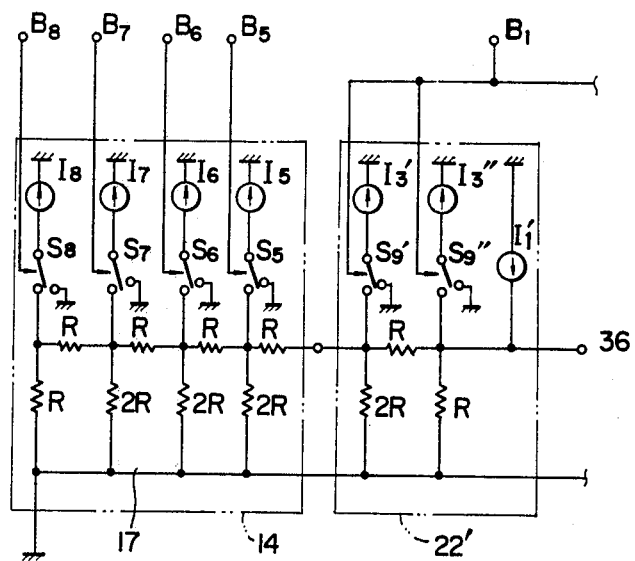
FIG. 6 is a circuit diagram showing another arrangement of the polarity changing circuit according to the invention.

FIG. 6 shows a fourth embodiment of the invention, in which the polarity changing circuit is arranged with two bits (used two current sources $I_3'$, $I_3''$ and two switches $S_9'$, $S_9''$), whereby a further stabilized non-uniform weighting circuitry in provided. Referring to FIG. 6, reference numeral 22' denotes generally the polarity changing circuit. In this embodiment, the circuit arrangement between the terminals 36 and 32 is same as those shown in FIGS. 4 and 5 and therefore omitted from the illustration in FIG. 6. In this polarity changing circuit, all the current values $I_1'$, $I_3'$, and $I_3''$ can be made equal to $I_0$ by setting the current values $I_5$, $I_6$, $I_7$ and $I_8$ equal to $I_0$. Accordingly, these current sources can be implemented with transistor circuits of the same construction in a parallel array by using a single reference voltage supplied from a single reference voltage source. In other words, the fact that the current values are equal to one another means that variation factor or coefficient of temperature or the like of the individual current sources are equal to one another, which in turn means that the characteristics are thereby improved.

Now, considering the application for an encoder, it is possible with the circuit shown in FIG. 6 to establish relations $I_3'/I_0=1$, $I_3''/I_0=1$ and $I_1'=I_0$, although $I_3/I_0=49/16$ in the case of the embodiment shown in FIG. 4. Similar relations will apply valid also for a decoder.

In the foregoing, the invention has been described in detail in conjunction with four embodiments. However, it will be appreciated the invention is never restricted to these embodiments. The non-uniform weighting circuitry using an attenuator according to the invention exhibits the non-uniform quantizing characteristic at a high speed with an enhanced accuracy without impairing intrinsic advantages of the non-uniform weighting circuitry. Thus, encoders and decoders with high speed and accuracy can be realized by using the non-uniform weighting circuitry according to the invention.

We claim:

1. A non-uniform weighting circuitry comprising:
   a uniform weighting circuit means for converting step bit signals to an analog signal,
   first means for supplying said analog signal with a positive or negative bias current in response to the polarity of a polarity bit signal, said first means providing an output signal,
   a variable attenuator circuit means for attenuating the output signal of said first means in response to segment bit signals, said variable attenuator circuit means including a decoder means for decoding the segment bit signals, a plurality of bi-directional switch means controlled by the output signal of said decoder means, and a resistor network means connected to one end of respective one of said plurality of bi-directional switch means, said variable attenuator circuit means providing an output signal,
   second means for supplying the output signal of said variable attenuator circuit means with a positive or negative bias current in response to the polarity of a polarity bit signal, and
   a first impedance conversion circuit means connected to an output terminal of said variable attenuator circuit means, said first impedance conversion circuit means having a low input impedance and providing an output signal, whereby spike-like noises generated by said bi-directional switch means are reduced.

2. A non-uniform weighting circuitry according to claim 1, wherein said plurality of bi-directional switch means have another end connected in common to constitute an output terminal of said variable attenuator circuit means.

3. A non-uniform weighting circuitry according to claim 1, further comprising a second impedance conversion circuit means connected between the input terminal of said variable attenuator circuit means and the output terminal of said first means, said second impedance conversion circuit means having a low output impedance.

4. A non-uniform weighting circuitry according to claim 2, wherein said resistor network means comprises a ladder resistor network having a plurality of terminals connected to the one end of said plurality of bi-directional switch means, said ladder resistor network having an input terminal connected to said first means.

5. A non-uniform weighting circuitry to be used for a decoder or encoder for preparing a code signal including a polarity bit, segment selecting bits, and uniform decoding bits, comprising:
   a constant current switching circuit driven by a polarity bit signal;
   a variable attenuator circuit connected in cascade to said switching circuit and adapted to be driven by a segment selecting bit signal, said variable attenuator circuit including an attenuation resistor network and a plurality of bi-directional switches;

a polarity changing circuit connected in cascade to said variable attenuator circuit and adapted to be driven by said polarity bit signal;

a uniform weighting circuit connected in cascade to said variable attenuator circuit and including a plurality of constant current sources, switches and a weighted resistor network, and adapted to be driven by a uniform decoding bit signal;

one end of said bi-directional switches being connected in common thereby to constitute at least one terminal of said variable attenuator circuit; and an amplifier means for impedance conversion, connected to said at least one terminal of said variable attenuator circuit, said amplifier means having a low input impedance when the input thereof is connected to said at least one terminal of said variable attenuator circuit and said amplifier means having a low output impedance when the output thereof is connected to said at least one terminal of said variable attenuator circuit, whereby spike-like noises generated by said bi-directional switches are reduced.

6. A non-uniform weighting circuitry according to claim 5, wherein said attenuation resistor network is constituted by a ladder resistor network having a plurality of terminals corresponding in number to the number of attenuation quantity changing steps, and wherein another end of said bi-directional switches are, respectively, connected to said plural terminals.

7. A non-uniform weighting circuitry according to claim 5, wherein said at least one terminal of said variable attenuator circuit includes an input terminal.

8. A non-uniform weighting circuitry according to claim 5, wherein said at least one terminal of said variable attenuator circuit includes an output terminal.

9. A non-uniform weighting circuitry according to claim 6, wherein said plurality of bi-directional switches correspond to the number of attenuation quantity changing steps, said at least one terminal of said variable attenuator circuit being an input terminal of said variable attenuator circuit, another end of said bi-directional switches being connected, respectively, to one end of resistors of resistor groups of said attenuation resistor network corresponding to the attenuation quantity changing steps, said resistors of said resistor groups having another end connected in common to provide an output terminal of said variable attenuator circuit, and further including load adjusting resistors each connected to each of the another end of said bi-directional switches.

10. A non-uniform weighting circuitry comprising:

a uniform weighting circuit means for converting step bit signals to an analog signal, first means for supplying said analog signal with a positive or negative bias current in response to the polarity of a polarity bit signal and having an output terminal, a variable attenuator circuit means for attenuating the output signal of said first means in response to segment bit signals said variable attenuator circuit means including an input terminal, a decoder means for decoding the segment bit signals, a plurality of bi-directional switch means controlled by the output signal of said decoder means, and a resistor network means connected to one end of respective ones of said plurality of bi-directional switch means, said variable attenuator circuit means providing an output signal, second means for supplying the output signal of said variable attenuator circuit means with a positive or negative bias current in response to the polarity of a polarity bit signal, a first impedance conversion circuit means connected between the input terminal of said variable attenuator circuit means and the output terminal of said first means, said first impedance conversion circuit means having a low output impedance, whereby spike-like noises generated by said bi-directional switch means are reduced, said plurality of bi-directional switch means having another end thereof connected in common to constitute the input terminal of said variable attenuator circuit means, said resistor network means comprising a ladder resistor network having a plurality of terminals connected to the one end of said plurality of bi-directional switch means, said ladder resistor network having an output terminal connected to said second means, and a second impedance conversion circuit means connected to the output terminal of said variable attenuator circuit means, said second impedance conversion circuit means having a low input impedance.

11. A non-uniform weighting circuit comprising:

a uniform weighting circuit means for converting step bit signals to an analog signal, first means for supplying said analog signal with a positive or negative bias current in response to the polarity of a polarity bit signal and having an output terminal, a variable attenuator circuit means for attenuating the output signal of said first means in response to segment bit signals said variable attenuator circuit means including an input terminal, a decoder means for decoding the segment bit signals, a plurality of bi-directional switch means controlled by the output signal of said decoder means, and a resistor network means connected to one end of respective ones of said plurality of bi-directional switch means, said variable attenuator circuit means providing an output signal, second means for supplying the output signal of said variable attenuator circuit means with a positive or negative bias current in response to the polarity of a polarity bit signal, a first impedance conversion circuit means connected between the input terminal of said variable attenuator circuit means and the output terminal of said first means, said first impedance conversion circuit means having a low output impedance, whereby spike-like noises generated by said bi-directional switch means are reduced, said plurality of bi-directional switch means having another end thereof connected in common to constitute the input terminal of said variable attenuator circuit means, said resistor network means comprising resistors corresponding to attenuation quantity changing steps, one end of said resistors being connected, respectively, to said plurality of bi-directional switch means, another end of said resistors being connected in common to provide an output terminal of said variable attenuator circuit means, and load adjusting resistors being connected to each of said plurality of bi-directional switch means, and a second impedance conversion circuit means connected to said output terminal of said variable attenuator means, said second impedance conversion circuit means having a low input impedance.

* * * * *